United States Patent [19]
Aruga et al.

[11] Patent Number: 5,688,331
[45] Date of Patent: Nov. 18, 1997

[54] RESISTANCE HEATED STEM MOUNTED ALUMINUM SUSCEPTOR ASSEMBLY

[75] Inventors: Michio Aruga, Tomisato; Atsunobu Ohkura, Yachimata; Akihiko Saito, Chiba; Kenji Suzuki; Kenichi Taguchi, both of Narita, all of Japan; Dale Robert DuBois, Los Gatos; Alan Ferris Morrison, Cupertino, both of Calif.

[73] Assignee: Applied Materisls, Inc., Santa Clara, Calif.

[21] Appl. No.: 673,599

[22] Filed: Jul. 1, 1996

Related U.S. Application Data

[63] Continuation of Ser. No. 225,956, Apr. 20, 1994, abandoned.

[30] Foreign Application Priority Data

May 27, 1993 [JP] Japan ..................... 5-126103

[51] Int. Cl.⁶ .................................................. C23C 16/00
[52] U.S. Cl. ............................................ 118/725; 118/728
[58] Field of Search ................................. 118/725, 728, 118/729, 730, 723 E, 723 R; 156/345; 204/298.15, 298.07, 298.33

[56] References Cited

U.S. PATENT DOCUMENTS 5,231,690   7/1993   Soma et al. ..................... 392/416

Primary Examiner—John Niebling
Assistant Examiner—Joni Y. Chang
Attorney, Agent, or Firm—Janis Biksa

[57] ABSTRACT

In CVD processes susceptors can be made of a thermally conductive ceramic such as aluminum nitride which has superior durability with respect to fluorine plasma. Such aluminum nitride susceptors can include an embedded heater element and/or embedded ground or RF electrodes which as a result of their embedment are protected from the deleterious effects of the processing chamber environment. The conductors leading to these elements are protected from exposure to the process chamber environment by passing through a cylindrical member filled with inert gas supporting the wafer support plate of said susceptor. Alternately, the conductors leading to these elements can be run through passages in a hermetically sealed stem supporting the susceptor wafer support plate. The stem passes through the wall of the processing chamber so that connections to the susceptor wafer support plate can be made outside the processing chamber. Such a stem supporting the susceptor support plate can also provide passages for passing vacuum and purge gas to the back of the wafer support plate. Vacuum and purge gas can then be distributed through passages in the wafer support plate as appropriate to its top surface for a vacuum chuck and perimeter purge gas flow.

9 Claims, 14 Drawing Sheets

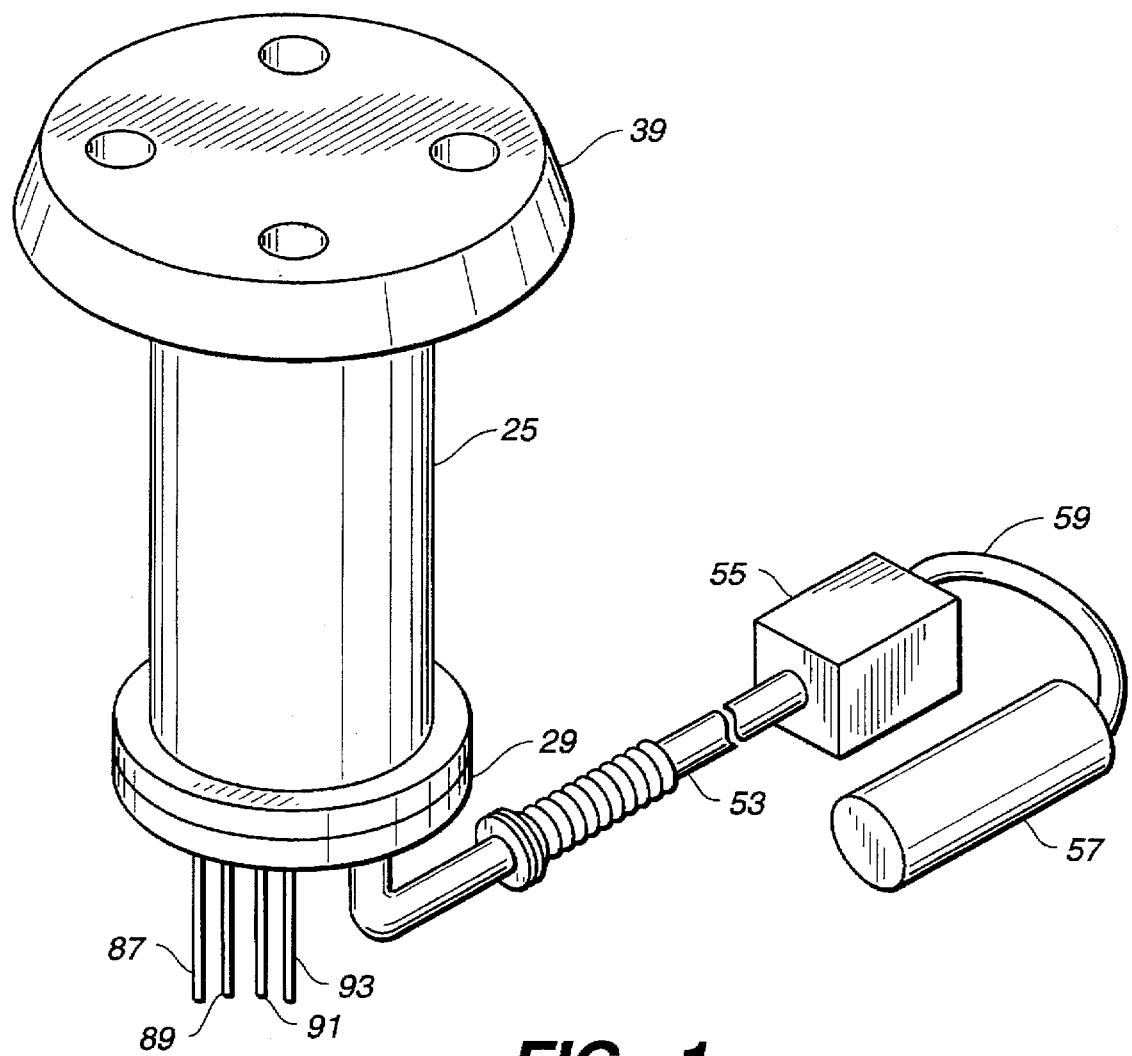
FIG._1

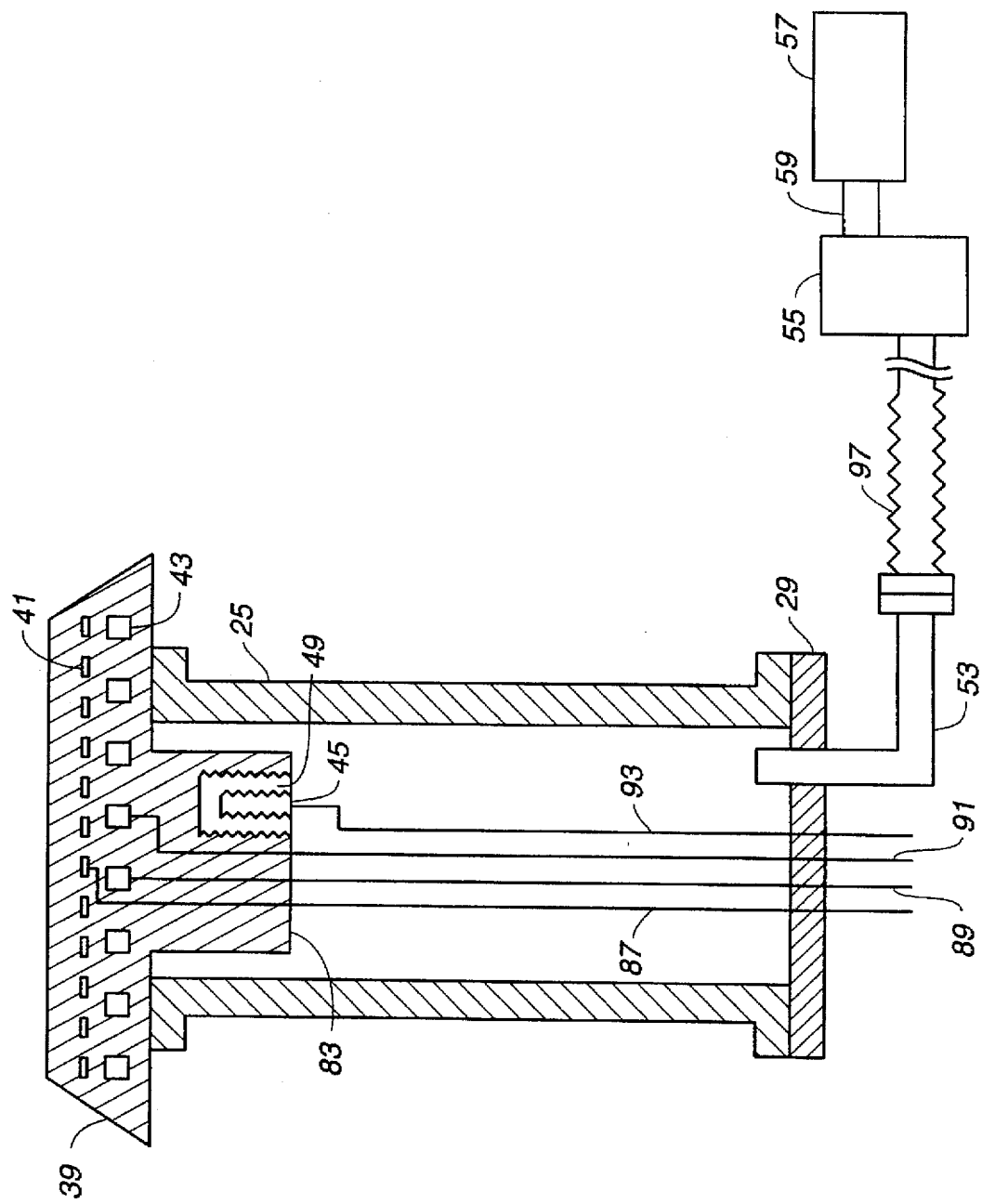
FIG._2

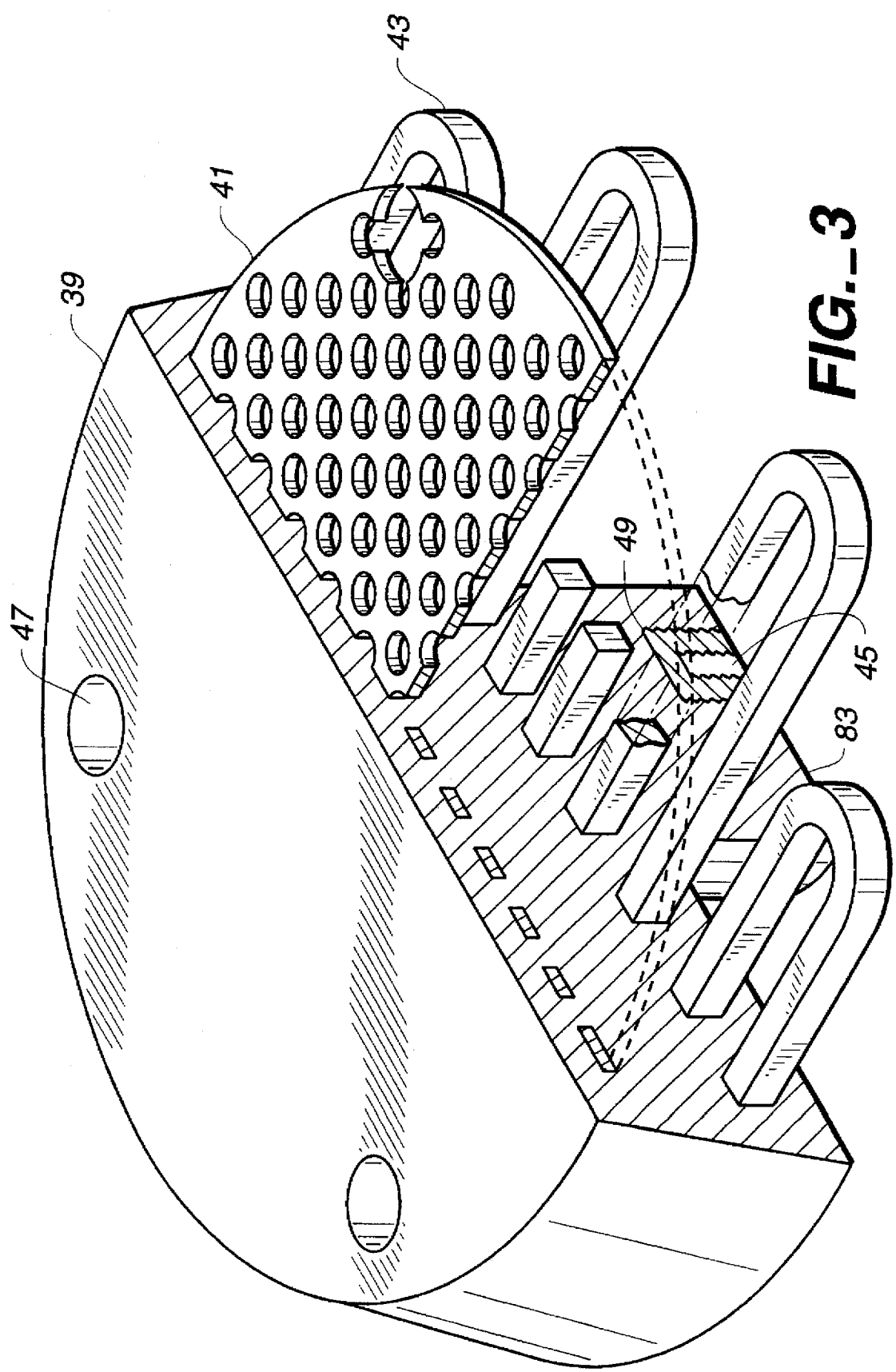
FIG._3

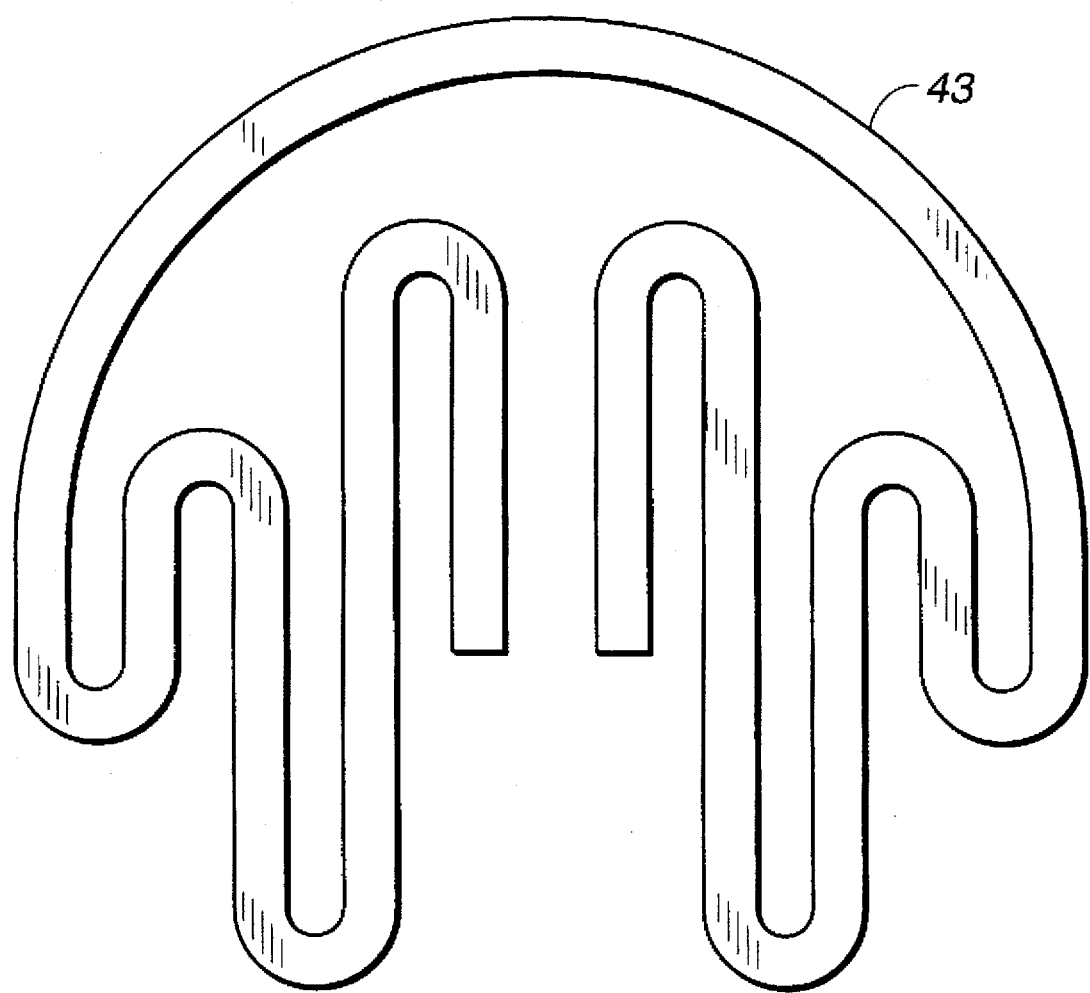
FIG._4
FIG._5

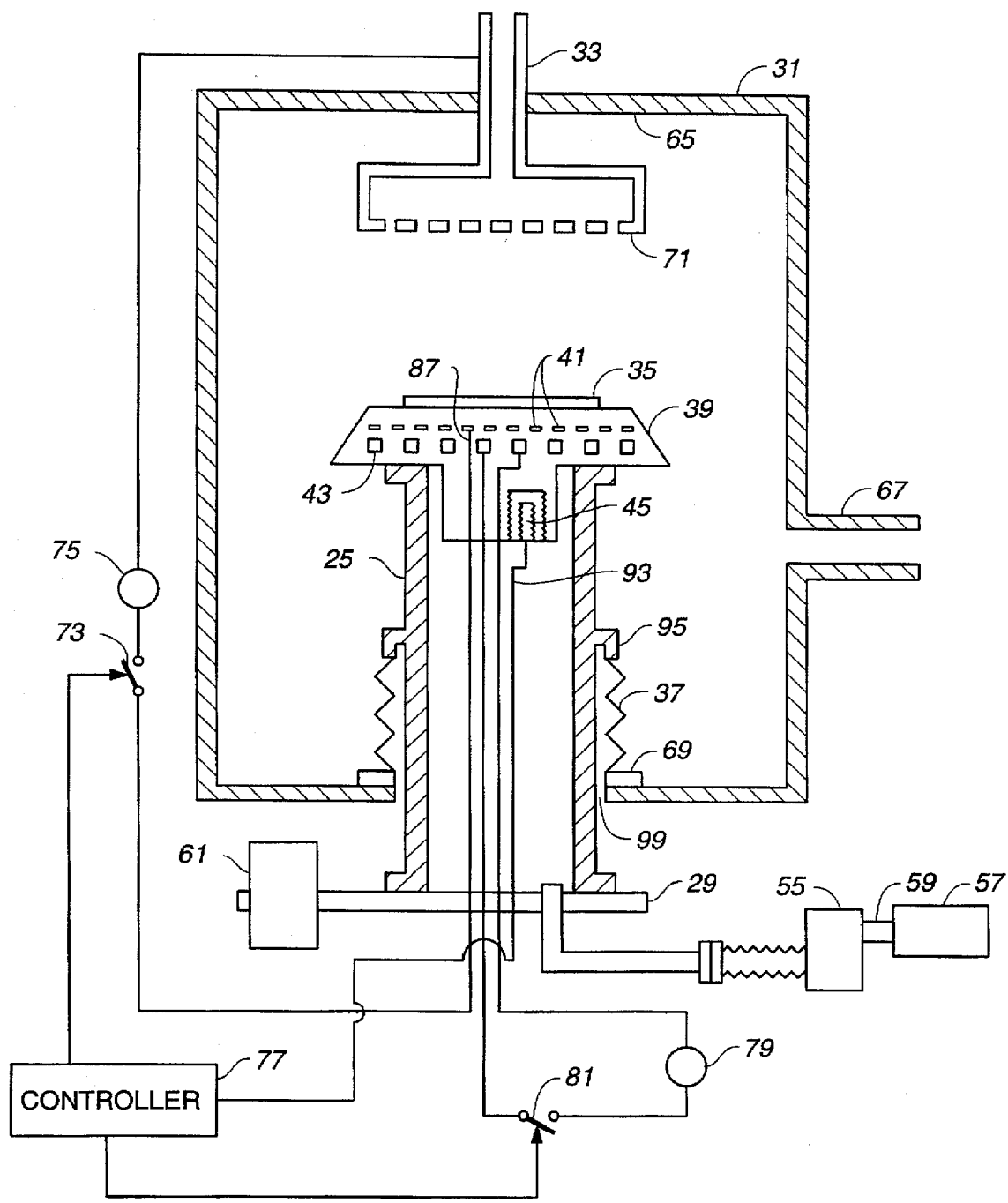
FIG._6

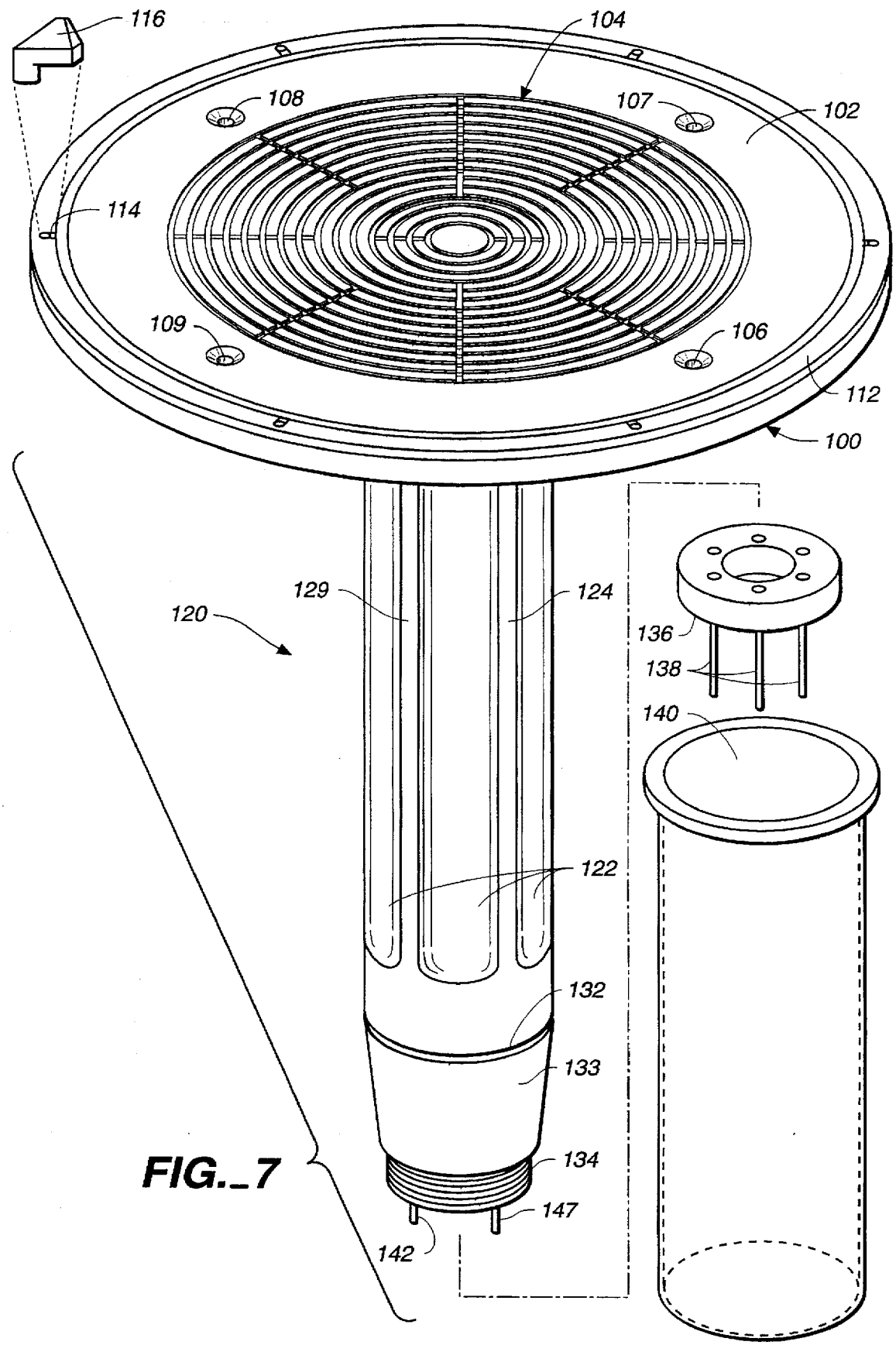
FIG._7

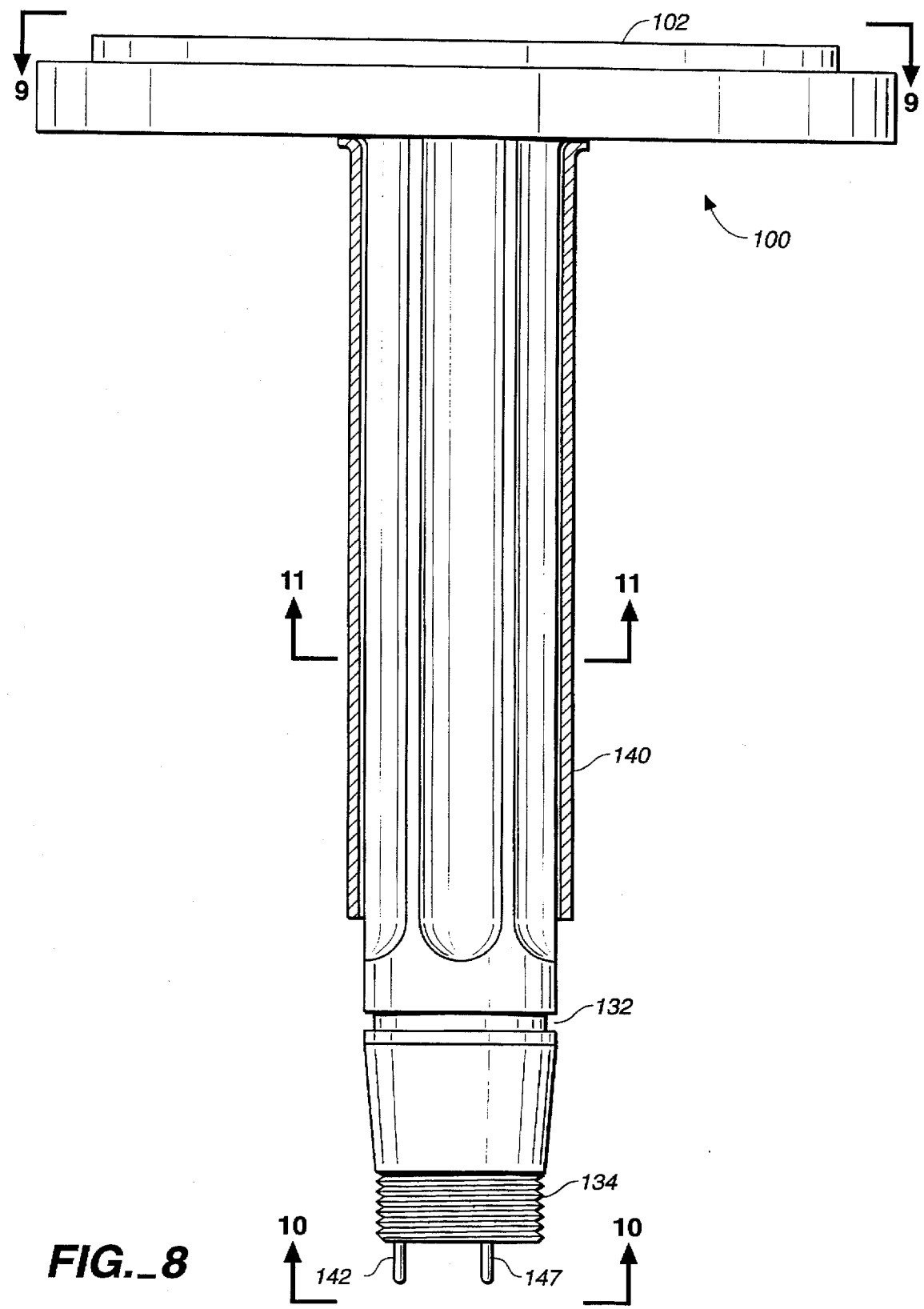
FIG._8

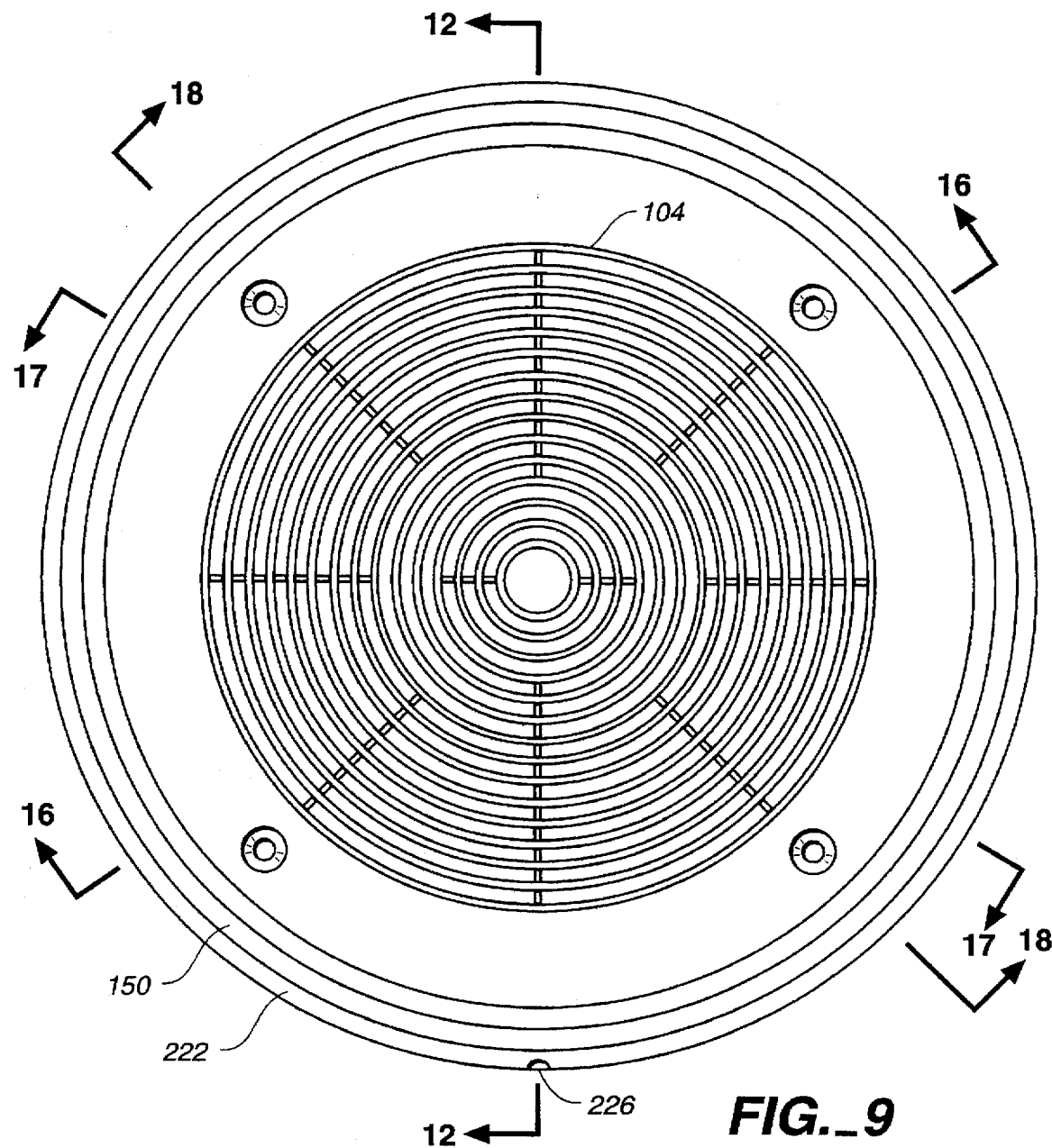
FIG._9
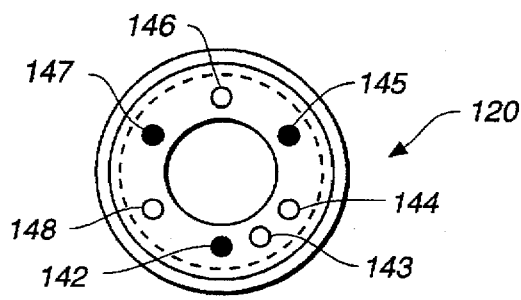
FIG._10
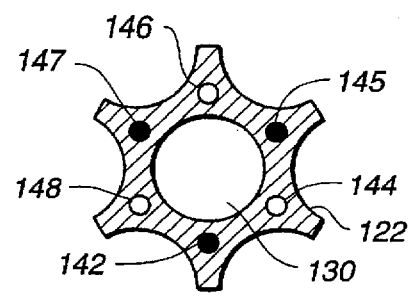
FIG._11

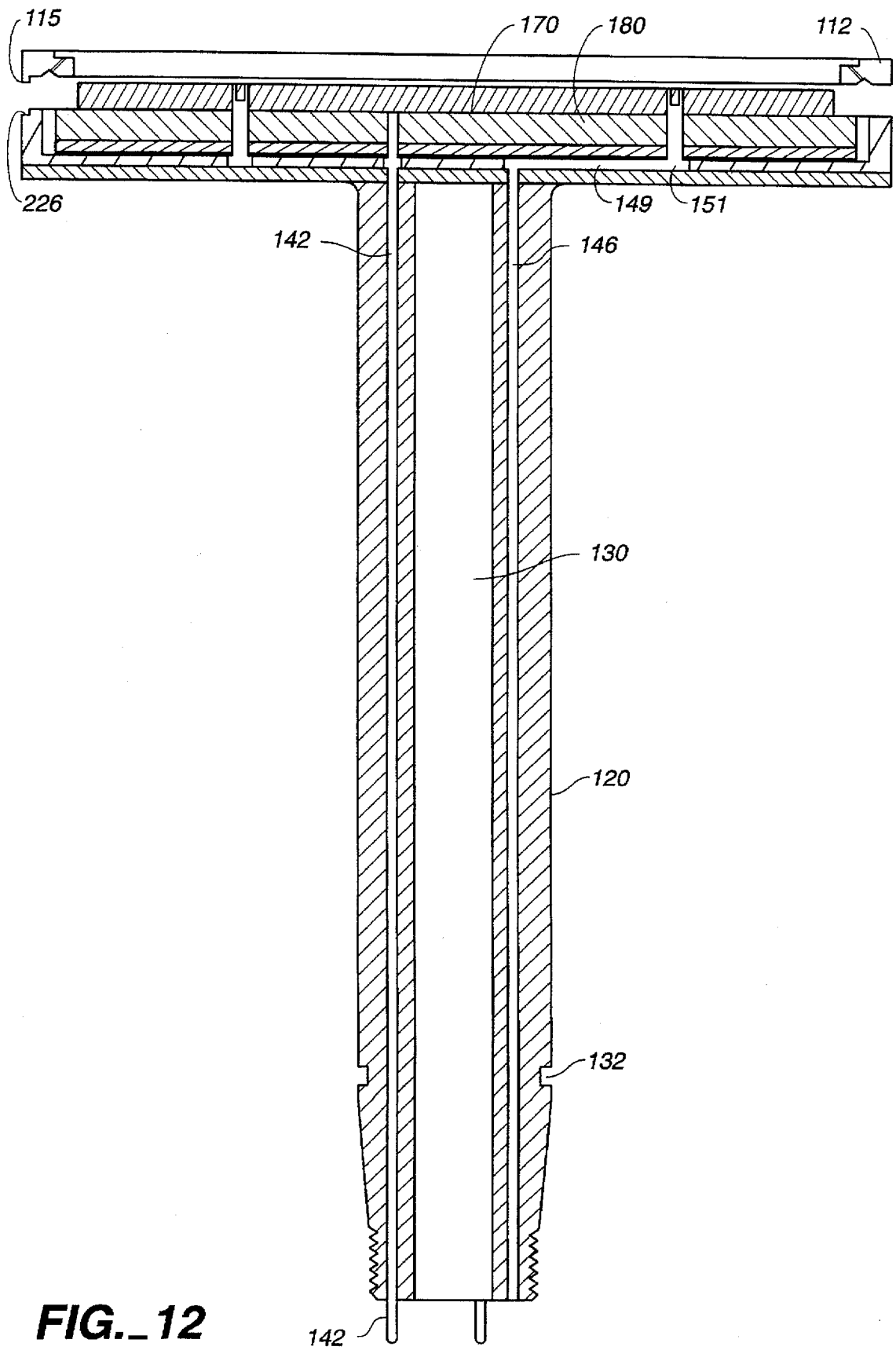
FIG._12

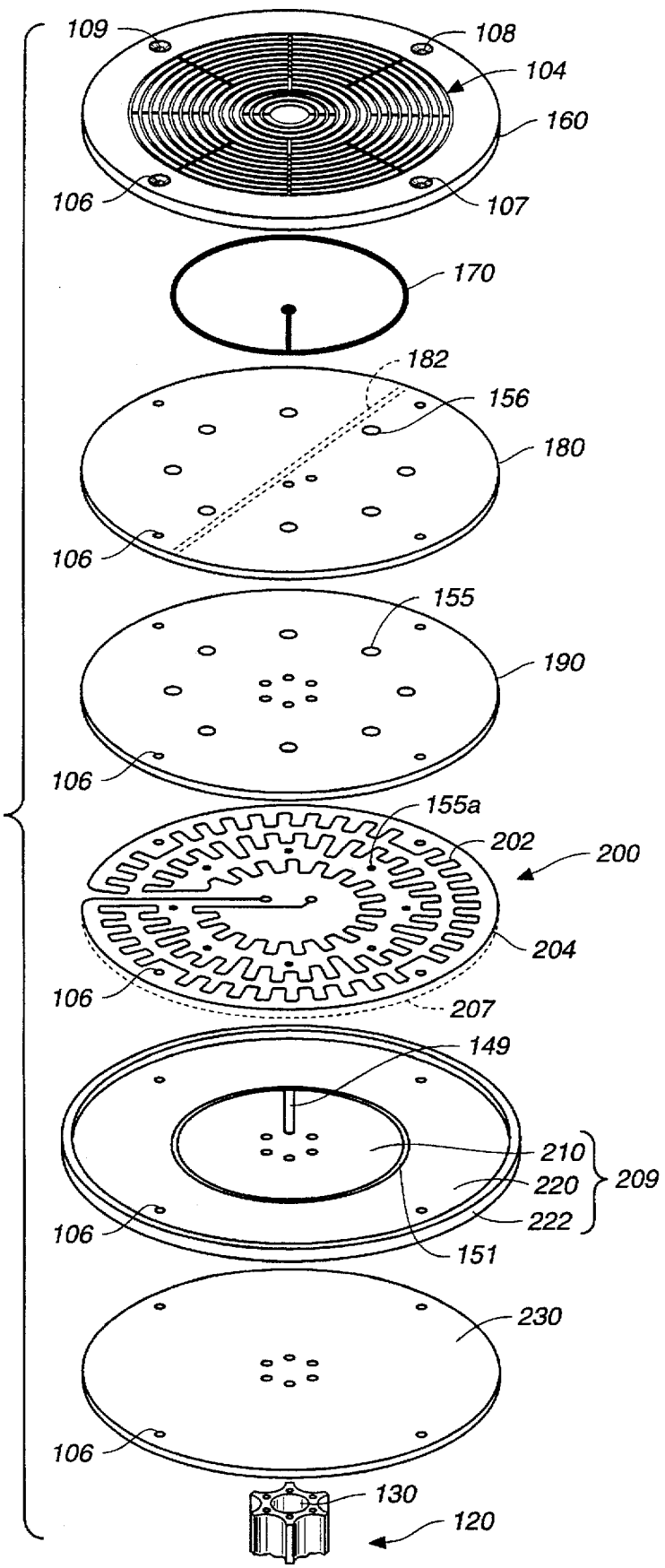
FIG._13

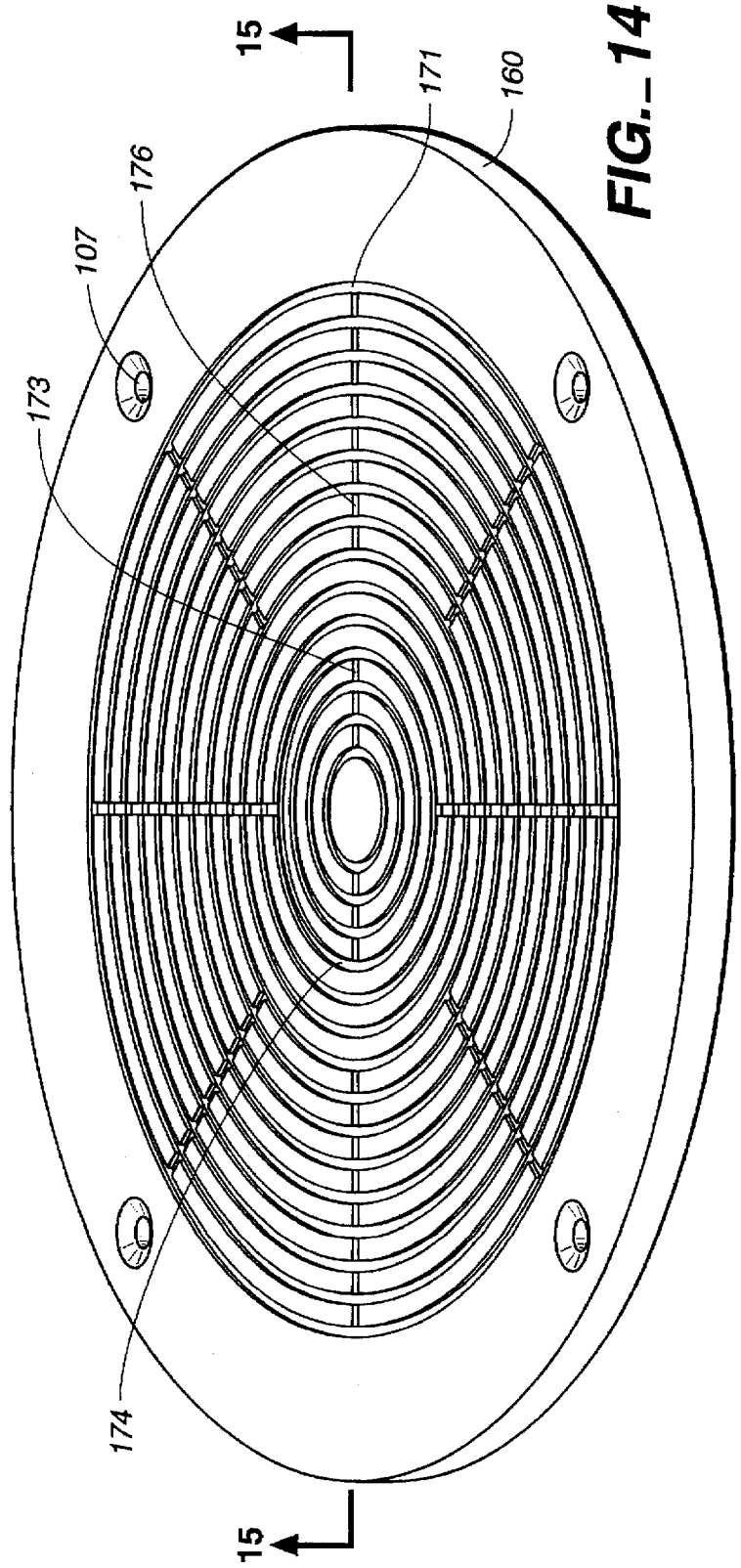
FIG._14
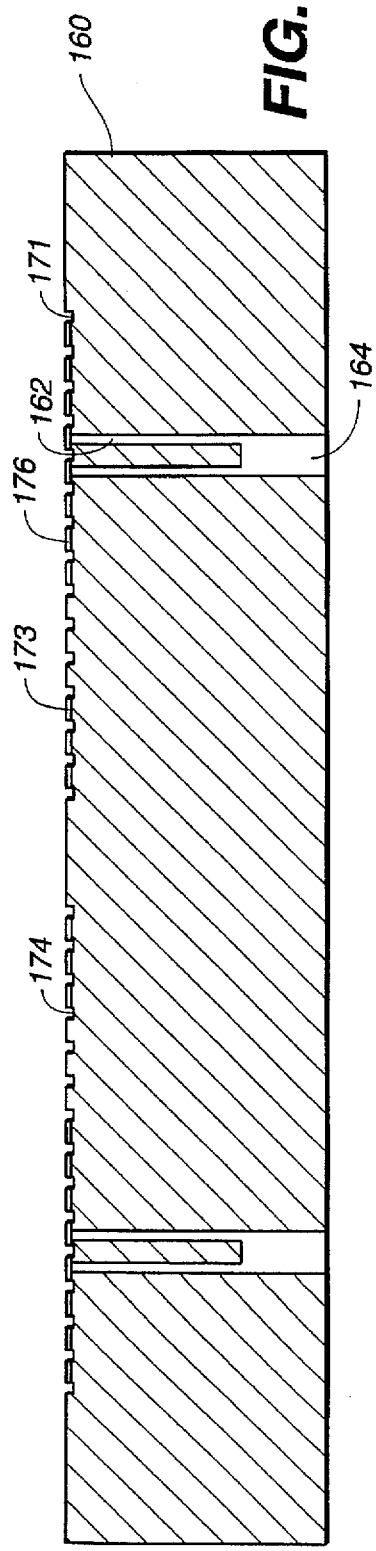
FIG._15

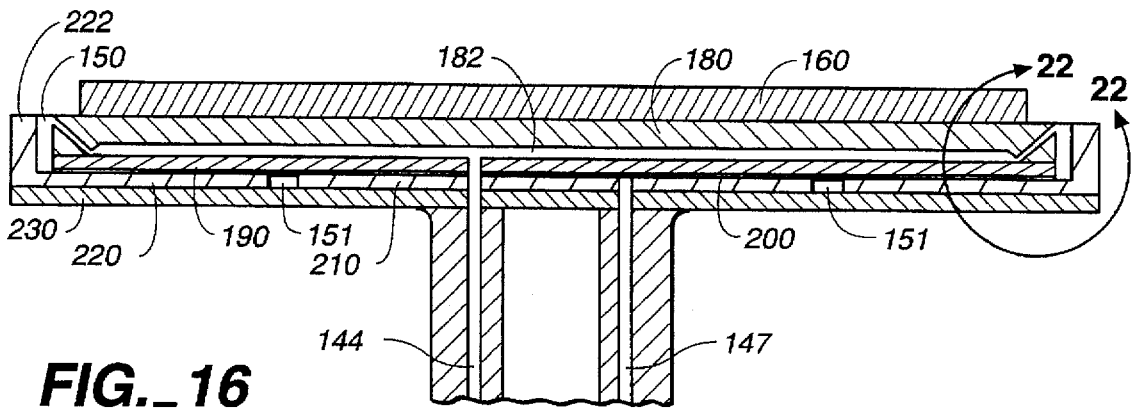
FIG._16
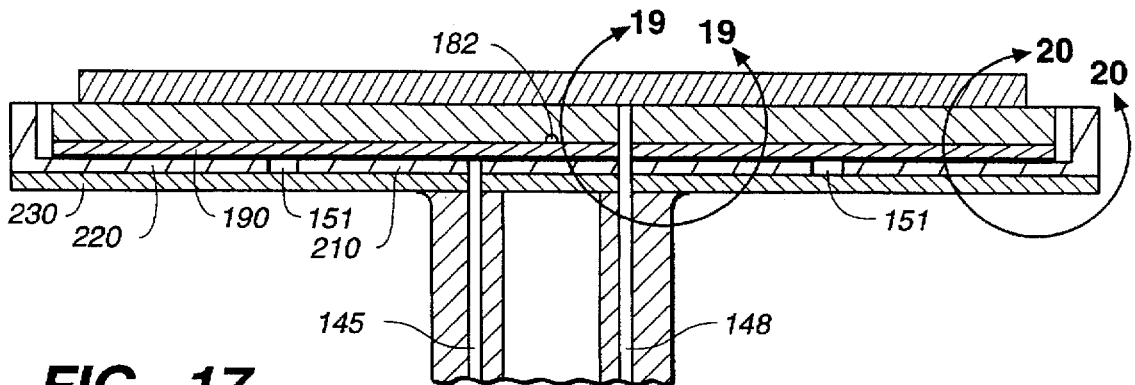
FIG._17
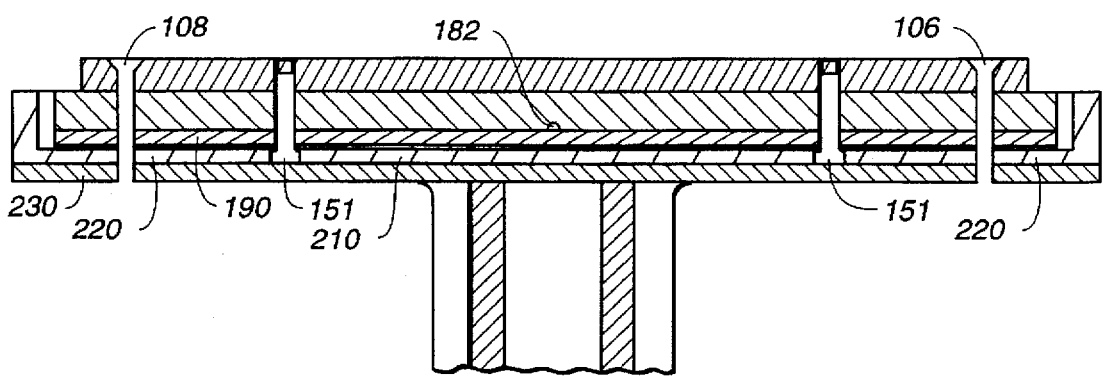
FIG._18

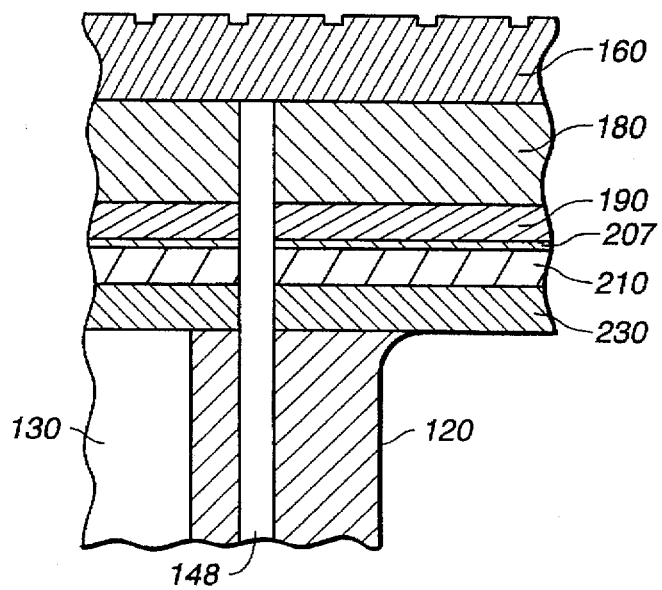
FIG._19
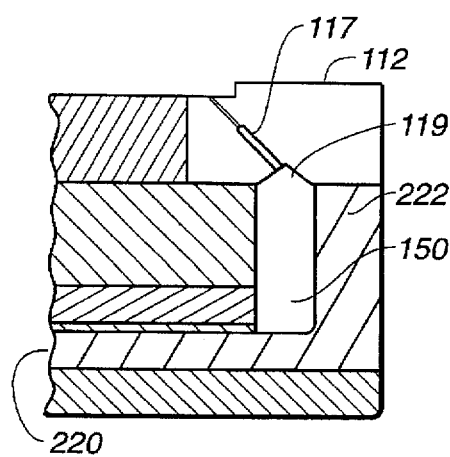
FIG._20
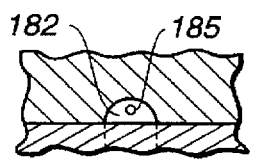
FIG._21
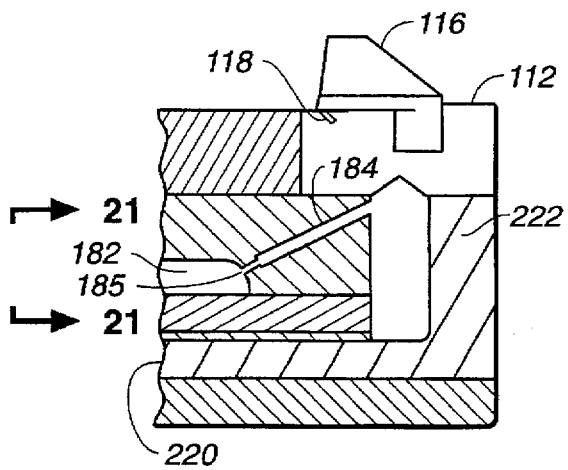
FIG._22

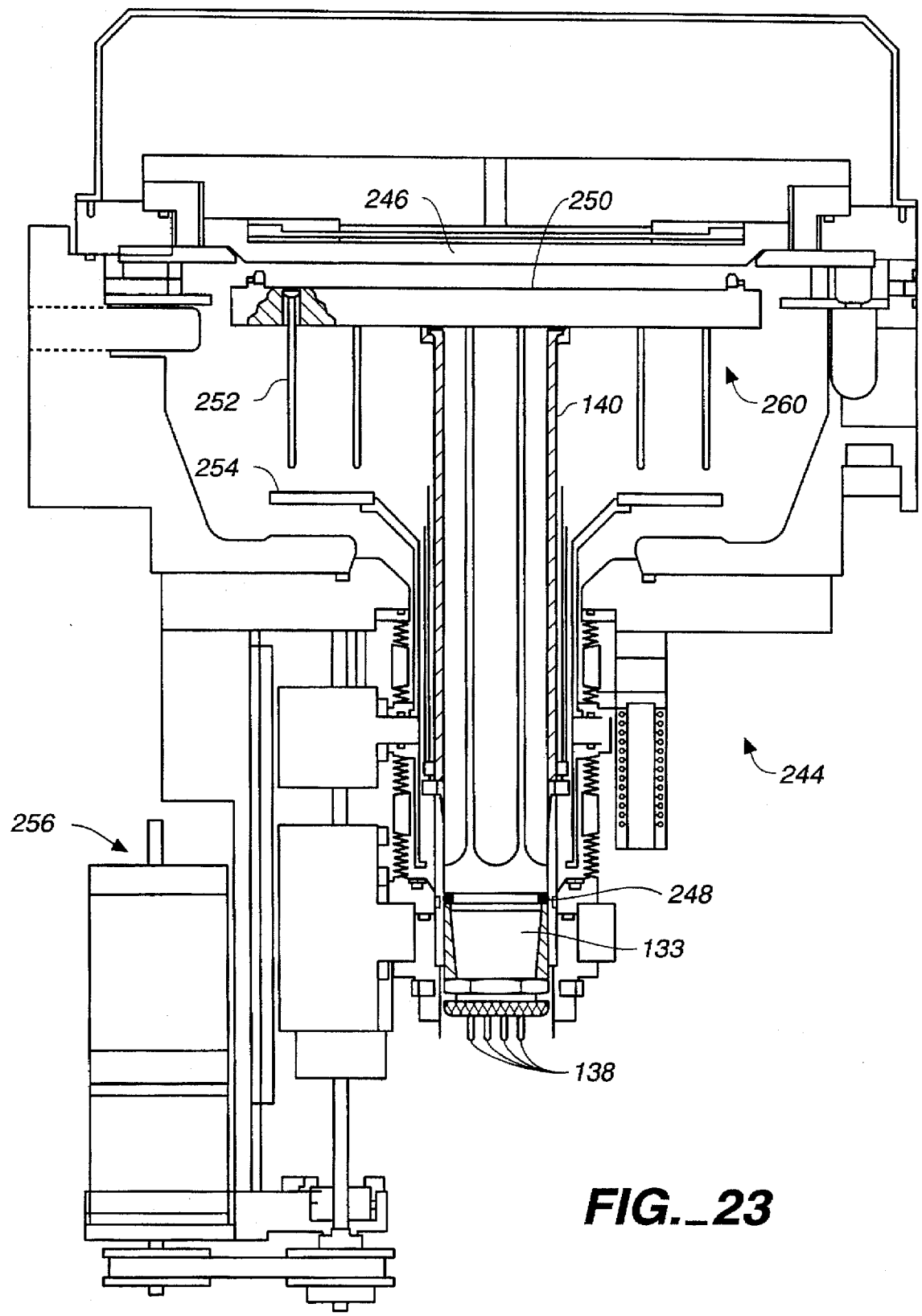
FIG._23

5,688,331

RESISTANCE HEATED STEM MOUNTED ALUMINUM SUSCEPTOR ASSEMBLY

This is a continuation of application of Ser. No. 08/225,956 filed on Apr. 20, 1994, now abandoned.

FIELD OF THE INVENTION

This invention relates to susceptors used in CVD (Chemical Vapor Deposition) devices and in particular to those devices which execute plasma reactions within a reaction chamber

BACKGROUND OF THE INVENTION

This application is related to U.S. application Ser. No. 08/146,370 filed Oct. 29, 1993, having several inventors in common, and all inventors being subject to an obligation to assign to a common entity.

To function properly, heat-resistant susceptor assemblies used in CVD devices must satisfy the following conditions.

First, the material used for a heat-resistant susceptor member must have high heat conductivity, must not deform, and must not deteriorate at high temperatures. Because in-situ chamber cleaning by plasma will be necessary, the material has to have superior plasma resistance. The susceptor must also function as an electrode to support a plasma reaction in the processing chamber. Further, it is important that the susceptor material have a high purity to prevent contamination by impurities.

Therefore, heat-resistant susceptor assemblies are conventionally made of metallic materials with good electrical conductivity. In particular, nickel alloys such as Monel, Hastelloy, etc., have conventionally been used to minimize the effects of corrosion due to fluorine plasma. For these reasons ceramic materials such as SiC and graphite are also widely used.

However, whether a susceptor assembly was made of a ceramic material such as SiC, graphite, etc., or a metallic material such as Monel, Hastelloy, etc., its corrosion resistance to fluorine plasma was not always acceptable. Therefore to enhance corrosion resistance the surfaces had to be protected by covering them with a protective film.

Also, resistance heating elements are sometimes provided inside parts of the susceptor assembly, e.g. the susceptor plate. The wiring connecting such heating elements to an outside power source must also be protected from the corrosive effects of fluorine plasma. Therefore, it is necessary to use a material with superior fluorine plasma resistance for the container and the cover protecting such wiring.

When metallic materials are used, sudden temperature changes may cause plastic deformation of susceptor members and also create problems with a protective film. The protective film can begin to peel off due to difference in the coefficient of thermal expansion between the protective film and the metallic materials.

When ceramic materials, such as SiC, graphite, etc., are used, plastic deformation does not easily occur. But when plasma cleaning is frequently performed, the protective film starts peeling off creating a problem.

Therefore, susceptor assemblies using metallic and ceramic materials had problem with durability and were therefore unreliable over a long-term.

Even when using ceramic members with superior fluorine plasma resistance, it was not conventionally possible to use ceramic members as containers or coverings to protect the wiring inside the device from fluorine gas. This is due to the fact that it is conventionally difficult to mutually adhere ceramic members to prevent the fluorine gas from seeping through joints between the ceramic members to the wiring.

The temperature of the susceptor wafer surface plate must be controlled and maintained within process limits as much as possible. Members supporting a susceptor wafer support plate often conduct thermal energy away from the wafer support surface creating differences in temperature whose variation can exceed process limits.

SUMMARY OF THE INVENTION

This invention provides a susceptor assembly for CVD devices which solves these problems.

The invention includes a susceptor assembly installed inside a CVD reaction chamber. Aluminum nitride is used as the material constituting the susceptor wafer support plate (plate or block), and a high-frequency electrode (electrode) and metallic heater (heater element) are embedded in the susceptor wafer support plate.

Aluminum nitride, which was found to have superior fluorine plasma resistance, is used as the material for the susceptor wafer support plate. As a result there is negligible generation of dust by, or, corrosion of the susceptor plate. An aluminum nitride susceptor plate can be used at high temperatures with negligible deformation. Also, aluminum nitride has good thermal conductivity so that temperature uniformity on the susceptor wafer support surface can be made favorable to process conditions.

The susceptor assembly has a closed bottom cylindrical member (support member) supporting the back of the susceptor plate. At least the side wall of the cylindrical member is comprised of a ceramic material. An inert gas feeding means provides inert gas to the inside of the cylindrical member. The inert feed gas is provided at a higher pressure than the pressure of the gas surrounding the cylindrical member so that the gas surrounding the cylindrical member does not feed into the cylindrical member.

Wiring to a high-frequency electrode and a metallic resistive heater, both embedded in the susceptor wafer support plate, exits the plate from its back surface. Thermocouple wiring connected to a thermocouple in the back of the susceptor plate also extends from the back of the plate. This wiring is routed through the cylindrical body to the outside. Consequently, this wiring as it passes through the cylindrical member filled with inert gas is not exposed to the process gas surrounding the cylindrical member.

In another embodiment, an electrical ground conductor (electrode) and a serpentine heater element with a guard loop at its perimeter (heater element) is embedded in a susceptor wafer support plate which has been formed by laminating several layers of aluminum nitride together using pressure assisted densification (PAD) techniques. This embodiment provides two separate gas passages to the surface of the susceptor wafer support plate. One gas passage routes gas from vacuum chuck openings on the surface of the susceptor wafer support plate to a vacuum source. The other gas passage routes purge gas from a gas source to the perimeter of the susceptor wafer support plate. A purge ring supported on the perimeter of the plate (but not bonded to it) directs the purge gas flow from the perimeter of the plate in a direction up and towards the center of the wafer.

A hollow fluted aluminum nitride susceptor stem is bonded to the back of the plate, also using PAD techniques. The seal between the stem and the back of the plate is hermetic, such that standards for leakage under a vacuum between the hollow center of the stem and the outside are met. The stem extends outside the processing chamber and passes through a seal in the wall of the processing chamber. The stem includes passages embedded in its walls and hermetically sealed to receive and pass the susceptor facilities, i.e. a ground conductor, heater element connection conductors, a vacuum supply, a purge gas supply, and a thermocouple access passage, from the end of the stem outside the processing chamber to corresponding facility receiving locations on the backside of the susceptor plate. An alumina heater support sleeve is installed around the fluted stem inside the processing chamber to somewhat protect the stem from the effects of full exposure to the process environment in the processing chamber and to minimize heat losses from the top of the stem due to radiation heat transfer.

BRIEF DESCRIPTION OF THE DRAWINGS

FIG. 1 is a perspective view of a susceptor assembly according to the invention;

FIG. 2 is sectional side view of the susceptor assembly of FIG. 1;

FIG. 3 is a partial cutaway perspective view of a susceptor wafer support plate according to the invention;

FIG. 4 is a plan view of a resistive heater element as partially shown in FIG. 3;

FIG. 5 is a side view of the heater element of FIG. 4;

FIG. 6 shows a susceptor assembly of FIG. 1 in context in a CVD processing chamber;

FIG. 7 is a perspective assembly view of another embodiment of a susceptor assembly according to the invention;

FIG. 8 is a side view of the susceptor assembly of FIG. 7;

FIG. 9 is a top view of the susceptor assembly of FIG. 7 as viewed from 9—9;

FIG. 10 is a bottom view of the susceptor assembly of FIG. 8 as viewed from 10—10;

FIG. 11 is a cross sectional view of FIG. 8 taken at 11—11;

FIG. 12 is a cross sectional view of FIG. 9 taken at 12—12;

FIG. 13 is an exploded view of the susceptor assembly of FIG. 7, without the purge ring and stem sleeve;

FIG. 14 is a perspective view of the top layer of the susceptor assembly of FIG. 13;

FIG. 15 is an exaggerated cross sectional view of FIG. 14 taken at 15—15;

FIG. 16 is a cross sectional view of FIG. 9 taken at 16—16;

FIG. 17 is a cross sectional view of FIG. 9 taken at 17—17;

FIG. 18 is a cross sectional view of FIG. 9 taken at 18—18;

FIG. 19 is a cross sectional close up view of FIG. 17 taken at 19—19;

FIG. 20 is a cross sectional close up view of FIG. 17 taken at 20—20;

FIG. 21 is a cross sectional close up view of FIG. 22 taken at 21—21;

FIG. 22 is a cross sectional close up view of FIG. 16 taken generally at 22—22; and FIG. 23 is a shows a susceptor assembly of FIG. 7 in context in a CVD processing chamber.

DETAILED DESCRIPTION

One Embodiment

An embodiment of a susceptor assembly according to the invention is shown in FIGS. 1 to 5.

As shown in FIGS. 1 and 2, the susceptor assembly of the embodiment is composed of a susceptor block (wafer support plate) 39 and a support stand (cylindrical member) 25 with a bottom plate 29. A gas feeding tube 53 is connected to the bottom plate 29 of cylindrical member 25. Wiring leads 89,91 for a heater 43, wiring leads 93 for a thermocouple 45, and a lead 87 to a high-frequency metallic electrode 41 are routed to pass through the bottom plate 29 of cylindrical member 25. The gas feeding tube 53 is connected to a mass flow controller 55 through a flexible tube 97. The mass flow controller 55 is connected to a gas cylinder 57 through a gas pipe 59.

Aluminum nitride, used for the susceptor support plate 39, is a source material which is conventionally known as a ceramic material with good heat conductivity. It was found that aluminum nitride also has superior resistance to corrosion from a fluorine plasma. In manufacturing aluminum nitride, it is necessary to mix yttrium or erbium as a removing agent (which enhances densification). However, there is a possibility that the addition of yttrium, etc., may have some kind of effect on the wafers being processed. Therefore, source mixtures for aluminum nitride having high purifies and a minimum of impurities such as yttrium, etc. are preferred.

Since aluminum nitride, which has the same degree of heat conductivity as aluminum, is used as the susceptor wafer support plate 39, the susceptor wafer support plate surface can achieve the same temperature uniformity as if it were made of aluminum.

As shown in FIG. 2, the cylindrical member 25 (preferably made of alumina, or other ceramic materials) has a hollow cylindrical shape. The heater leads 89, 91, the thermocouple lead 93, and the RF electrode lead 87 which originate from the susceptor wafer support plate 39 pass through the inside of the cylinder and through the bottom plate 29.

The susceptor wafer support plate 39 is mounted on the top surface of the cylindrical member 25 and is fixed to it with screws (not shown). The susceptor hub 83 of the susceptor plate 39 is positioned within the cylindrical member 25. According to the invention, the susceptor wafer support plate 39 is made of a solid member of aluminum nitride.

The flat plate 29 is mounted to the bottom surface of the cylindrical member 25 with screws (not shown). Holes to pass the thermocouple lead 93, the heater leads 89, 91, the RF electrode lead 87, and the gas feeding tube 53 through the bottom plate 29 and into the cylindrical member 25 are made at prescribed positions in the plate 29. The gas feeding tube 53 has a flexible tubing middle section 97 and is connected to the mass flow controller 55 as noted above and feeds inert gas (e.g. argon, etc.) from the mass flow controller 55 into the cylindrical member 25.

By continuously feeding inert gas into the cylindrical member 25, a pressure differential with the external gas atmosphere is created which prevents external gas from leaking into the cylindrical member 25. For example, when the gas atmosphere surrounding the cylindrical member 25 is corrosive such as provided by fluorine gas, etc. wiring leads from the back of the susceptor wafer support plate 39 would normally be subject to severe corrosion. However when using a configuration according to the invention, inert gas inside the cylindrical member 25 displaces any corrosive gas from inside the cylindrical member 25 and prevents the corrosive gas from reaching the leads, thereby preventing corrosion of the leads. This inert gas feed is provided because in this configuration it is difficult to perfectly adhere the alumina cylindrical member 25 to the bottom of the aluminum nitride susceptor wafer support plate 39 to maintain a perfect gas tight seal.

As shown in FIG. 3, the high-frequency metallic electrode plate (RF metallic electrode plate or electrode) 41, the heater 43, and the thermocouple 45 are embedded in the susceptor wafer support plate 39, which is constructed of a solid body of aluminum nitride.

The outer circumference of the susceptor wafer support plate 39 gradually expands, like the surface of a cone, from the top surface to the bottom surface. Its bottom surface includes a cylinder shaped hub 83 extending from the center of the bottom of the susceptor wafer support plate 39.

There are four through-holes (lift pin hole) 47 in the susceptor wafer support plate 39. Lift pins (not shown) are inserted into the lift pin holes 47 to raise the wafer from the susceptor wafer support plate 39 to transfer the wafer to and from the plate's surface easy.

The RF metallic electrode plate 41 is embedded near the top surface of susceptor wafer support plate 39. This RF metallic electrode plate 41 is a disk-shaped metallic plate perforated with holes to form a mesh. The RF metallic electrode plate 41 is connected to the RF electrode lead 87. A high-frequency current is fed to the RF metallic electrode plate 41 from an outside power source through the RF electrode lead 87.

The heater 43 is embedded near the back (bottom) surface of susceptor wafer support plate 39. Namely, the heater 43 is provided below the RF metallic electrode plate 41. A rectangular rod (heating element) is configured to snake back and forth in the pattern shown in FIGS. 4 and 5, is used. The heater rod 43 can also be configured in other shapes such as a spiral. Electrical current is fed to each end of the rectangular rod constituting the heater element 43 via heater leads 89,91.

The thermocouple 45 is provided in the hub 83 of the susceptor wafer support plate 39. This thermocouple 45 is fixed to the hub 83 through a metallic member (threaded hollow cylindrical metallic member—threaded thermocouple bushing) 49. To secure the thermocouple bushing 49, a hole is tapped at a predetermined location in the back of the ceramic hub 85. Then, the bushing 49 is screwed into this tapped hole. The bushing 49 has a hollow cavity with threads to receive the threaded thermocouple 45. The bushing 49 is made of nickel which has superior fluorine resistance and superior heat conductivity. The reason for interposing a metallic member 49 and not inserting the thermocouple 45 directly into the susceptor wafer support plate 39 is that the ceramic material of the susceptor wafer support plate 39 is fragile and the risk of breakage increases with each successive thermocouple removal and replacement cycle. The thermocouple wiring lead 93 connects the thermocouple 45 to an external information processor controller such as a computer (not shown).

A CVD device which uses the susceptor assembly described above is shown in FIG. 6. An exhaust port 67 is provided on the side surface of a processing chamber 31 of the CVD device. A hole 99 with a larger diameter than that of cylindrical member 25 is provided at the bottom surface of the processing chamber 31. The susceptor assembly as described above is provided through the hole 99 and into the processing chamber 31.

A first bellows holding part (flange) 95 with an L-shaped cross section is provided on the outer circumferential surface of cylindrical member 25 above the center part of the member 25. A second bellows holding part (flange) 69 is provided on the inside of the processing chamber 31 at the periphery of the hole 99. A bellows 37 is held between the fast and second bellows holding flanges 95,69.

An elevator 61 is connected to the bottom plate 29 and moves the bottom plate 29 vertically to adjust the distance between susceptor wafer support plate 39 and a gas spray nozzle assembly (process gas supply assembly) 33.

The gas spray nozzle assembly 33 is provided on ceiling (top) surface 65 of the processing chamber 31. The gas spray nozzle assembly 33 is configured so that a spray port (gas distribution plate) 71 and the upper surface of the susceptor wafer support plate 39 face each other. The gas spray nozzle assembly 33 also acts as an RF electrode, the second electrode of a pair, the first electrode being the RF metallic electrode plate 41 provided in the susceptor assembly. The gas spray nozzle assembly 33 and the RF metallic electrode plate 41 are connected to a high-frequency power source 75 through the RF electrode lead 87 and switch 73. The susceptor thermocouple 45 is connected and provides output signals to a controller 77 via the thermocouple lead 93. The heater 43 is connected to a power source 79 through the heater leads 89, 91 and a switch 81.

The controller 77 controls the heater 43 by cycling the switch 81 ON and OFF based on the information from the thermocouple 45, and also controls energization of the RF electrodes by controlling the ON or OFF status of the switch 73.

An $SiO_2$ film can be formed on a semiconductor substrate using this device as follows. First, the switch 81 is turned ON and electrical current is fed from power source 79 to heater 43. The temperature of susceptor wafer support plate 39 is heated to over 700° C. with heater 43. Next, a semiconductor substrate 35 is placed on the susceptor wafer support plate 39. TEOS, which is the source material gas of $SiO_2$, and an oxidizer are provided to the gas spray nozzle assembly 33 and are sprayed onto the semiconductor substrate 35. The semiconductor substrate 35 is heated for a prescribed time while feeding the source material gas. In this way, an $SiO_2$ film is formed on semiconductor substrate 35.

During the process of depositing $SiO_2$ film on the substrate 35, an $SiO_2$ film is also deposited on the walls of the processing chamber 31. The processing chamber 31 must be cleaned to remove this excess $SiO_2$. Cleaning is accomplished as follows. Fluorine gas is provided to the gas spray nozzle assembly 33 and switch 73 is turned ON providing voltage to the gas spray nozzle assembly 33 and the RF metallic electrode plate 41. The gas flow and electrode energization causes the fluorine gas to form a plasma inside the processing chamber 31. The fluorine gas plasma etches the $SiO_2$ away to clean the inside of the processing chamber 31.

Because aluminum nitride with superior fluorine plasma resistance is used as the material for the susceptor wafer support plate 39, there is hardly any generation of dust or corrosion of susceptor wafer support plate 39. Even if one plate is used for a long time there is no abrasion of the surface; so a covering with a protective film is not necessary. Absence of a protective film eliminates the film peeling problem observed in conventional susceptors.

Furthermore, since the RF metallic electrode plate 41 is embedded in the susceptor wafer support plate 39, the fluorine plasma cannot influence it. Consequently, there is no problem of corrosion of the metal electrode due to the fluorine plasma. Further, inert gas is constantly fed to the cylindrical member 25, as described above, and prevents the wiring leads within the cylindrical member 25 from being corroded by fluorine gas, etc.

The CVD device as described for this embodiment can also form metal films such as tungsten, etc., and is not limited to $SiO_2$ film. This CVD device can also be used in plasma CVD (PECVD) processing. The RF metallic electrode plate 41 and gas spray nozzle 31 act as electrodes to form the plasma for plasma CVD.

In contrast to low temperature applications 0°–100° C. where aluminum nitride coatings have a compatible coefficient of expansion with alumina and with silicon carbide, when subjected to high process temperature 650°–750° C. the use of aluminum nitride coatings with alumina are unacceptable, and with silicon carbide only marginally acceptable.

Another Embodiment

Another embodiment according to the invention is shown in FIGS. 7 through 23. This embodiment provides a susceptor assembly constructed of several generally flat layered members of aluminum nitride material bonded together and to an aluminum nitride stem using ceramic pressure assisted densification (PAD) techniques. A ground electrode and a heater element are sandwiched between the flat layered members of aluminum nitride. Vacuum passages to a vacuum chuck on the surface of the susceptor, purge gas passages to the perimeter of the susceptor, and a thermocouple access hole are provided in and between the layers of aluminum nitride. The susceptor facilities (ground connection, heater first lead, heater second lead, vacuum connection, purge gas connection, and thermocouple access) are all provided to the susceptor wafer support plate through separate closed passages in the wall of a hollow fluted susceptor stem. The susceptor stem extends through the wall of a processing chamber so that none of the corrodable items of the susceptor facilities are exposed to corrsive process gasses.

FIG. 7 shows an overview of this embodiment. A wafer support plate assembly 100 has an upper surface 102 including a vacuum chuck groove pattern 104 and four wafer lift pins holes 106,107,108,109.

The upper surface 102 is surrounded by a purge ring 112 supported on, but not bonded to the wafer support plate assembly 100. The purge ring 112 has six sites 114 for receiving six wafer guide pins 116 (only one of which is shown enlarged).

A hollow fluted susceptor stem 120 supports and is bonded to the plate assembly 100. The stem 120 includes six flutes 122 on its outside surface creating a series of ridges, e.g., 124,129, between the flutes. An O-ring groove 132 near the bottom of the stem 120 accommodates an 0-ring for making a seal through the wall of a processing chamber. A tapered stem section 133 is shaped to support the susceptor against a complementarily shaped external support. Threads 134 on the bottom of the stem 120 secure the stem tapered section 133 to the external support and also hold a facilities connector body 136 to the bottom of the stem once the susceptor is in place in a processing chamber. Facilities wiring and tubing 138 are connected to and through the facilities connector body 136. An alumina heater support tube 140 slips over the outside of the bottom end of the stem 120. The tube 140 protects the stem somewhat from the effects of full exposure to the process environment in the processing chamber and helps to minimize heat losses from the top of the stem due to radiation heat transfer.

Pins 142,147 fixed in the susceptor stem 120 for connection to a ground terminal and to one end of the heater element, respectively, can be seen extending from the end of the stem 120.

FIG. 13 shows the elements which are ultimately bonded together to form a one piece aluminum nitride wafer support plate assembly 100.

The wafer support plate assembly 100 consists of several generally flat disks of generally solid aluminum nitride and the stem 120, which are bonded together using pressure assisted densification (PAD) techniques. The inventors are unaware of the details of the bonding parameters and rely on the experience and expertise of their fabricator Cercom, Inc., 1960 Watson Way, Vista, Calif. 92083 U.S.A. Cercom processes the pieces to adhere one to the other in manner so that the bonding meets the inventors'performance criteria goal of satisfying a vacuum leak test with helium of equal to or better than $1 \times 10^{-7}$ torr-liter/sec.

The wafer facing disk (or fast, or top layer) 160 includes a vacuum chuck groove pattern 104 and lift pin holes 106,107,108,109. The top layer 160 is approximately 0.25" (6.3 mm) thick.

Below the top layer 160, a ground loop (electrode) 170 (including a straight surface lead to the circular loop) consists of a layer of tungsten approximately 0.0005" (0.013 mm) thick adhered (for example by vapor deposition) to either the underside of the top layer 160 or to the top side of the second layer 180. The electrode 170 is electrically connected (preferably by electron beam welding) to the ground pin 142 extending from the bottom of the stem 122 to act as a ground.

The second (or purge gas groove) layer 180 includes a diametric purge gas groove 182 in its lower surface (shown in dashed lines in FIG. 13) to pass purge gas from a purge gas passage 144 (to be described later) in the stem 120 to a perimeter purge distribution channel 150 (FIGS. 16 and 20). Through holes are provided in this second layer 180 to supply facilities to the top layer 160, i.e., ground pin passage, thermocouple passage, vacuum chuck supply passages 156, and lift pin holes 106. The 2nd layer 180 is approximately 0.296" (7.52 mm) thick.

A third (or heater coil pattern) layer 190 is provided below the 2nd layer to close the purge gas groove 182 in the bottom of the 2nd layer. A heater coil arrangement 200 adheres to its bottom surface. Through holes are provided in this third layer to supply facilities to the top layer 160 and 2nd layer 180, i.e., ground pin passage, thermocouple passage, purge gas passage, vacuum chuck supply passages 155, and lift pin holes 106. The third layer 190 is approximately 0.145" (3.68 mm) thick.

The heater coil arrangement 200 consists of a layer of tungsten approximately 0.0005" (0.013 mm) thick adhered (for example by vapor deposition) to the underside of the third layer 190. The heater coil element is arranged in a sinusoidal-type serpentine pattern 202 along three serially connected concentric circles. The normal undulating pattern deviates only to avoid vacuum passage 155a and lift pin holes 106 passing through the pattern. A guard perimeter heater ring loop 204 serially connects to one end of the serpentine pattern 202 and surrounds its perimeter. The resistive guard perimeter loop 204 increases the energy input to the susceptor at its perimeter to compensate for the normally larger thermal losses at the perimeter. The geometric configuration of the serpentine pattern 202 and the ring loop 204 generally compensates for lower temperatures because of larger heat losses at the perimeter and therefore allows for use of a single zone heater control. The whole heater element—serpentine portion 202 and guard heater ring 204—has an installed resistance of approximately 7.14 ohms at 20° C. The heater element is electrically connected (preferably by electron beam welding) to the heater electrode pins 145, 147 extending up from the bottom of the stem 120.

The bottom of the heater element 200 is covered with a paper thin, 0.031" (0.79 mm) layer 207 of aluminum nitride. This layer 207 during bonding acts as sort of a filler material to cover the heater element 200 and separate it from the next layer below. Through holes allow facilities to pass through this layer to the upper layers.

A vacuum distribution (or fourth) layer 209, consisting of two separate pieces, a disk-shaped fourth layer inner piece 210 and an annular fourth layer outer piece 220, is provided below the third layer and the paper thin layer 207. The fourth layer inner piece 210 includes a radial groove 149 which extends the vacuum passage 146 from the stem 120 to the circular perimeter of the fourth layer inner piece 210. The fourth layer outer piece 220 has a circular inner diameter greater than the outside diameter of the inner piece 210 such that when the two are generally concentrically located they form an annular passage 151 between them to distribute vacuum around the susceptor to holes, e.g. 155, connecting to the susceptor surface vacuum chuck groove pattern 104. The fourth layer outer piece 220 includes a perimeter flange 222 as shown in FIGS. 16 and 20 which forms the outer wall of the a perimeter channel 150 around the second (180) and third (190) layers to assist in distributing the purge gas. Through holes are provided in these fourth layer pieces 210, 220 to supply facilities to the upper layers, i.e., ground pin passage, thermocouple passage, purge gas passage, heater element pin passages, and lift pin holes 106. The fourth layer 209 inside the outer flange 222 is approximately 0.125" (3.18 mm) thick. The outer flange 22 rises approximately 0.597" (15.16 mm) above the lower surface of the layer (approximately level with the top of the second layer 180) and has a thickness of 0.195" (4.95 mm).

The bottom fifth layer 230 bonds to the bottom of the fourth layer 209 to close the annular vacuum passage between the inner 210 and outer 220 pieces of the fourth layer 209. The bottom of this fifth layer is bonded to the top of the susceptor stem 120. All facilities pass through respective through holes to upper layers. The 5th fifth layer 230 is approximately 0.123 (3.12 mm) thick.

The first through fifth layers above (160,170,180,190,200, 209, 230) when bonded together constitute the wafer support plate assembly 100. The wafer support plate assembly 100 together with the susceptor stem 120 and purge ring 112 constitutes this embodiment of a susceptor assembly according to the invention. Details and orientations of the various pieces can be understood from the detailed description of the figures which follows.

FIG. 8 shows a side view of the susceptor of FIG. 7 with the purge ring 112 removed and the heater support tube 140 shown in cross section. In this view the ledge normally occupied by the purge ring 112 can be seen at the perimeter of the top of the assembly 100.

FIG. 9 shows a top view of FIG. 8 as viewed from 9—9. The perimeter purge gas distribution channel 150 is located just inside the outer flange 222. An alignment indentation 226 to orient the purge ring 112 is provided to mate with a purge alignment key 115 (FIG. 12) on the ring 112. A vacuum chuck groove pattern 104 connected to the vacuum passage facility through the top layer 160 is provided in the center of the top surface. Details of the vacuum chuck groove pattern can be seen in FIG. 14. FIG. 15 provides a cross section of the top layer 160 with a greatly exaggerated vertical dimension. The vacuum chuck pattern 104 includes a series of concentric channels 171 interconnected by somewhat shallower cross channel grooves at the perimeter 176 and near the center 173. One circumferential groove 174 connects the central radial grooves 173 with the outer radial grooves 176. The cross channel grooves 176 connect to a series of eight vacuum supply passages 164 equally spaced around the center. Each vacuum supply passage 164 connects to two narrower plasma choking vacuum outlet holes 162. These holes 162 are sized to prevent the plasma of a cleaning gas, e.g. fluorine, etc. from reaching far into the vacuum passages.

FIG. 10 shows an end view of the bottom of the susceptor stem 120. The ground connector pin 142, an alignment reference hole 143, the purge gas passage 144, the (1st) heater element connector pin 145, the vacuum passage 146, the (2nd) heater element connector pin 147, and a thermocouple passage hole 148 are provided counter clockwise around the wall of the hollow cylindrical susceptor stem 120.

FIG. 11 shows a cross section of the stem 120 taken at 11—11 in FIG. 8. The facilities connections 142,144,145, 146,147, 148 are as previously described, are embedded in the wall of the stem and are sealed from one another. The flutes 122 which extend all the way up the stem 120 to the bottom layer 230 of the susceptor plate assembly 100, reduce the cross sectional area of the stem while maintaining a relatively high structural rigidity. The reduction in area reduces the cross section through which thermal energy can be conducted away from the wafer support plate assembly 100 thereby reducing the thermal energy lost due to conduction down the stem 120. The hollow center 130 of the stem also helps reduce thermal losses as it is filled with air, which is a poor conductor of thermal energy.

FIG. 12 shows a cross section of FIG. 9 taken at 12—12. The ground connecting pin 142 is a tungsten rod approximately 0.093" (2.36 mm) in diameter. The pin 142 has a pin head approximately 0.156" (3.96 mm) in diameter to retain and fix the top end of the pin 142 to its ground loop 170 in a shallow counter bore at the top of the second layer 180. The head of the pin 142 is electrically connected to the ground loop 170 by electron beam welding (as described above). The ground facility hole for the ground pin passing through the stem 120 and various layers of the wafer plate assembly 100 is approximately 0.125" (3.175 mm) in diameter which allows the ground pin to freely expand and contract during changes in temperature, but still prevents the pin head from being pulled from the ground loop 170. The route of the vacuum passage through the stem and to the surface of the wafer support assembly 100 is shown. The stem O-ring groove 132 on the outside of the stem 120 defines the dividing line between susceptor assembly components above the O-ring groove 132 which are exposed to vacuum and therefore must be hermetically tight to withstand the helium leak testing as previously described, and those components which are exposed to atmosphere and need not be leak tested, that is, those below the O-ring groove 132 and those inside the hollow center 130 of the stem 120.

FIG. 12 also shows a cross section of the purge ring 112. The purge ring 112, as shown, is in a position elevated from its operating location. When it is in its operating position the purge ring alignment key 115 mates with the wafer support assembly's 100 alignment groove 226.

FIG. 16 shows a cross section of FIG. 9 taken at 16—16. The second heater power pin 147 is shown connecting to the heater element layer 200. Its installation and configuration are similar to that described above for the ground pin 142. The opening of the annular vacuum passage 146 can be seen above the bottom layer 230. The purge gas passage 144 is shown connecting to the purge gas groove 182 in the second layer 180. The purge gas groove 182 connects through an orifice 185 to a discharge passage 184 (FIGS. 21, 22) leading to the perimeter channel 150 inside the circumferential flange 222.

FIG. 17 shows a cross section of FIG. 9 taken at 17—17. The first heater power pin 145 is shown connecting to the heater element layer 200. Its installation and configuration are similar to that described above for the ground pin 142. The thermocouple hole 148 is shown passing from the stem 120 through all the layers except the top layer 160. Two thermocouples (not shown) are mounted inside the end of a tube abut to the back side of the top layer 160. One thermocouple is calibrated to provide a signal to a temperature controller (not shown). The other thermocouple is connected to an over temperature interlock sensor (not shown). The thermocouple tube is smaller than the thermocouple hole 148 and is spring mounted to the facilities connector body 136 to continuously urge the thermocouples against the back of the top layer 160 and to allow for thermal expansion of the tube during operation.

FIG. 18 shows a cross section of FIG. 9 taken at 18—18. Two of the eight vertical passages connecting the vacuum passage 46 to the surface of the wafer support plate assembly 100 are shown. Lift pins holes 106 and 108 can be seen.

FIG. 19 is a close up of thermocouple hole 148 of FIG. 17. The layers of the wafer support plate assembly 10 as previously described can be seen.

FIGS. 20 and 22 show close up views of cross sections of the perimeter of the plate assembly 100. The purge ring 112 is shown in place (although in FIG. 22 a guide pin 116 (as shown in FIG. 7) is angularly disposed at only six locations around the perimeter of the ring 112—those locations being at radii projected to the ring at arcs consecutively of 35, 55, and 55 degrees from the purge ring alignment key around either side of the perimeter—the pin 116, therefore, is not actually located above the purge gas passage 184). The bottom of the purge ring 112 covers the top of the purge distribution perimeter channel 150. The ring 112 has groove 119 on its bottom side into which 240 equally spaced orifice holes 117 (having a narrowing orifice near one end) are provided around the ring 112 to direct the purge gas flow toward the edge of a wafer being processed (not shown) on the susceptor. The orifice holes 117 empty into a narrow angular circumferential groove 118 which further distributes the purge gas flow from the 240 orifice holes 117. The purge gas flow forms a continuous gas sheet flowing from the groove 118 thereby preventing the deposition of process gas around the edge and on the backside of a wafer.

FIG. 23 shows the susceptor assembly of this embodiment in position in a processing chamber 244. The processing chamber 244 includes a gas distribution plate 246 facing a susceptor wafer support surface 250. The susceptor assembly 260 is supported on its tapered stem section 133 which is moved up and down and secured to a susceptor lift mechanism 256 by a locknut 135. The process chamber 244 is sealed around the susceptor assembly 260 at a stem seal 248. Susceptor facilities 138 are connected to the end of the stem. Four wafer lift pins 252 hang from the lift pin holes in the susceptor. When the susceptor descends the ends of the lift pin contact a lift finger support ring 254 causing the lift pins 252 to raise the wafer for transfer. The lift finger support ring 254 also moves up and down to transfer the wafer to and from a robot blade (not shown) which transfers wafers into and out of the processing chamber 244.

This embodiment provides an internally heated susceptor with a relatively small stem (approx. 2" (50.8 mm) O.D.) in a compact processing chamber.

While the invention has been described with regards to specific embodiments, those skilled in the art will recognize that changes can be made in form and detail without departing from the spirit and scope of the invention.

We claim:

1. A susceptor, comprising:

a susceptor wafer support plate composed of aluminum nitride having an electrically conductive element embedded therein, said plate including a back side from which wiring connected to said electrically conductive element embedded therein emerges;

a support stand configured to form a tube, said tube having a first end configured to form a joint with said back side of said support plate, said joint is positioned to surround the location from which said wiring emerges, wherein said support member includes side walls composed of a ceramic material, said support member being configured to support said susceptor wafer support plate, said tube having a second end which is closed with a bottom plate, said support member said support stand and said bottom plate forming the limits of a pressurizable cavity, the cavity having holes therein to pass wiring connected to said electrically conductive element from said cavity, said holes being sealed;

wherein said cavity includes a gas supply opening connected to an inert gas source feeding inert gas into said pressurizable cavity.

2. A susceptor comprising:

a susceptor wafer support plate composed of aluminum nitride having a heater element and an electrode embedded therein, wherein said heater element is positioned on a first plane generally parallel to a wafer support surface of the support plate and said electrode is positioned in a second plane generally parallel to the wafer support surface of the support plate;

wherein said susceptor wafer support plate is fixed to a susceptor stem fixed to a back side of said susceptor wafer support plate, wherein said susceptor stem is adapted to engage a seal of an opening through a wall of a processing chamber as said stem passes through said opening to an outside of said processing chamber, wherein electrical leads to said heater element and an electrical lead to said electrode pass through said stem to said outside of a processing chamber without exposure to gasses of said processing chamber, and wherein said susceptor wafer support plate further includes a vacuum supply passage embedded therein, said passage includes a feed section passing from the end of the susceptor stem and into the back of the support plate to a third plane generally parallel to the water support surface of the support plate, the feed section connects to a lateral section of the vacuum passage running generally along said third plane to a portion of a distribution supply passage also running generally along said third plane to extend said vacuum passage around a central axis of the wafer support plate and said susceptor stem, a series of surface sections of said vacuum passage extend from said distribution section of said vacuum passage to a series of vacuum openings in the wafer support surface of said wafer support, the vacuum openings open into a portion of grooves of a vacuum chuck pattern on a top surface of the susceptor wafer support plate.

3. A susceptor comprising:

a susceptor wafer support plate composed of aluminum nitride having a heater element and an electrode embedded therein wherein said heater element is positioned on a first plane generally parallel to a wafer support surface of the support plate and said electrode is positioned in a second plane generally parallel to the wafer support surface of the support plate;

wherein said susceptor wafer support plate is fixed to a susceptor stem fixed to a back side of said susceptor wafer support plate, wherein said susceptor stem is adapted to engage a seal of an opening through a wall of a processing chamber as said stem passes through said opening to an outside of said processing chamber, wherein electrical leads to said heater element and an electrical lead to said electrode pass through said stem to said outside of a processing chamber without exposure to gasses of said processing chamber, and wherein said susceptor wafer support plate further includes a vacuum supply passage embedded therein, said passage includes a feed section passing from the end of the susceptor stem and into the back of the support plate to a third plane generally parallel to the wafer support surface of the support plate, the feed section connects to a lateral section of the vacuum passage running generally alone said third plane to a portion o a distribution supply passage also running generally along said third plane to extend said vacuum passage around a central axis of the wafer support plate and said susceptor stem, a series of surface sections of said vacuum passage extend from said distribution section of said vacuum passage to a series of vacuum openings in the water support surface of said wafer support, the vacuum openings open into a portion of grooves of a vacuum chuck pattern on a top surface of the susceptor wafer support plate.

wherein said susceptor wafer support plate further includes purge gas passage embedded therein said passage includes a feed section from the end of the susceptor stem and into the back of the support plate to a third plane generally parallel to the wafer support surface of the support lysate the feed section connects to a lateral section of the vacuum passage running generally along said third plane to a set of passage extending from said distribution section of said purge passage to a perimeter channel of a top surface of said wafer support plate.

4. A susceptor comprising:

a susceptor wafer support plate composed of aluminum nitride having a heater element and an electrode embedded therein;

wherein said heater element includes a single continuous wiring/heater loop combination patterned substantially on a single continuous plane in a pattern connecting to a set of electrode leads located substantially adjacent to one another in said plane, said pattern including a heater element, at least first portion of said element running substantially along a series of partial concentric circles of progressively changing diameter, the element of said first portion forming a serpentine type path along the tangential path of the partial concentric circles, said pattern of partial concentric rings being formed in a pattern which provides a path for a portion of the wiring/heater loop to run in said single continuous plane from an outside edge of said pattern to one of said set of electrode lead without crossing another portion of said wiring/heater loop, wherein a second portion of said wiring/heater loop includes a heater ring loop running substantially along a path of a concentric circle adjacent to the perimeter of the wafer support plate substantially without a serpentine path.

5. A susceptor comprising a susceptor wafer support plate composed of aluminum nitride having a heater element embedded therein;

wherein said susceptor wafer support plate is fixed to a susceptor stem fixed to a back side of said susceptor wafer support plate, wherein said susceptor stem sealingly passes through a wall of a processing chamber to an outside of said processing chamber, wherein electrical leads to said heater element pass through said stem to said outside of a processing chamber without exposure to gasses of said processing chamber, and wherein an outside surface of said stem includes geometric features which reduce the cross sectional area of the stem.

6. A susceptor as in claim 5, wherein said geometric features includes fluting on an outside surface of said stem.

7. A susceptor as in claim 6, wherein a tube separate from said stem surrounds a portion of said stem adjacent to said susceptor wafer support plate.

8. A susceptor as in claim 5, wherein a tube separate from said stem surrounds a portion of said stem adjacent to said susceptor wafer support plate.

9. A susceptor as in claim 2, wherein said distribution vacuum passage includes a lateral section connected to an arc section and the surface sections of the vacuum passage connect between the arc section and said series of vacuum opening in the wafer support surface.

* * * * *